(12) United States Patent
Otremba et al.

(10) Patent No.: US 7,727,813 B2
(45) Date of Patent: Jun. 1, 2010

(54) METHOD FOR MAKING A DEVICE INCLUDING PLACING A SEMICONDUCTOR CHIP ON A SUBSTRATE

(75) Inventors: Ralf Otremba, Kaufbeuren (DE); Xaver Schloegel, Sachsenkam (DE); Rupert Fischer, Maxhette-Haidhof (DE); Tien Lai Tan, Melaka (MY)

(73) Assignee: Infineon Technologies AG, Neubiberg (DE)

( * ) Notice: Subject to any disclaimer, the term of this patent is extended or adjusted under 35 U.S.C. 154(b) by 81 days.

(21) Appl. No.: 11/944,724

(22) Filed: Nov. 26, 2007

(65) Prior Publication Data

US 2009/0137086 A1    May 28, 2009

(51) Int. Cl.
*H01L 21/58* (2006.01)
*H01L 21/60* (2006.01)

(52) U.S. Cl. .............. 438/118; 438/616; 257/E23.151; 257/E23.02; 257/E23.026

(58) Field of Classification Search .......... 257/E23.151, 257/E23.02, E23.026; 438/118, 616
See application file for complete search history.

(56) References Cited

U.S. PATENT DOCUMENTS

| | | | | |
|---|---|---|---|---|
| 5,696,033 A | * | 12/1997 | Kinsman | 29/593 |
| 5,830,800 A | * | 11/1998 | Lin | 438/459 |
| 5,930,603 A | * | 7/1999 | Tsuji et al. | 438/127 |
| 6,348,399 B1 | * | 2/2002 | Lin | 438/616 |
| 6,353,255 B2 | * | 3/2002 | Miyazaki et al. | 257/668 |
| 6,383,838 B2 | * | 5/2002 | Ryu | 438/106 |
| 6,569,709 B2 | * | 5/2003 | Derderian | 438/109 |
| 6,573,123 B2 | * | 6/2003 | Li et al. | 438/123 |
| 6,596,564 B2 | * | 7/2003 | Sakamoto et al. | 438/118 |
| 7,638,879 B2 | * | 12/2009 | Jiang et al. | 257/766 |
| 2002/0175400 A1 | * | 11/2002 | Gerber et al. | 257/686 |
| 2003/0075798 A1 | * | 4/2003 | Ono | 257/747 |
| 2007/0059865 A1 | * | 3/2007 | Huang et al. | 438/123 |
| 2007/0145573 A1 | | 6/2007 | Otremba | |
| 2007/0284720 A1 | | 12/2007 | Otremba et al. | |
| 2009/0127682 A1 | * | 5/2009 | Kim et al. | 257/676 |

FOREIGN PATENT DOCUMENTS

| | | |
|---|---|---|
| DE | 10393164 T5 | 8/2005 |
| DE | 10393232 T5 | 9/2005 |
| DE | 102004021054 A1 | 11/2005 |
| DE | 112004000258 T5 | 2/2006 |
| DE | 112004000564 T5 | 3/2006 |
| WO | 0137338 A2 | 5/2001 |
| WO | 2004077547 A2 | 9/2004 |

OTHER PUBLICATIONS

"Chinese Office Action issued Jan. 22, 2010". for App. No. 2008010176383.

* cited by examiner

*Primary Examiner*—George Fourson
(74) *Attorney, Agent, or Firm*—Dicke, Billig & Czaja, PLLC

(57) ABSTRACT

A method for making a device is disclosed. One embodiment provides a substrate having a first element protruding from the substrate. A semiconductor chip has a first electrode on a first surface and a second electrode on a second surface opposite to the first surface. The semiconductor chip is placed over the first element of the substrate with the first surface of the semiconductor chip facing the substrate. The second electrode of the semiconductor chip is electrically coupled to the substrate, and the substrate is at least partially removed.

10 Claims, 4 Drawing Sheets

ME THOD FOR MAKING A DEVICE
INCLUDING PLACING A SEMICONDUCTOR
CHIP ON A SUBSTRATE

BACKGROUND

This invention relates to a method of making a device including placing a semiconductor chip on a substrate and a device including a semiconductor chip placed on a substrate.

For example, power semiconductor chips may be placed on a substrate. Power semiconductor chips are suitable for the switching or control of currents and/or voltages. Power semiconductor chips may be configured as power transistors, power diodes or IGBTs (Insulated Gate Bipolar Transistors).

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

Figure 1A:
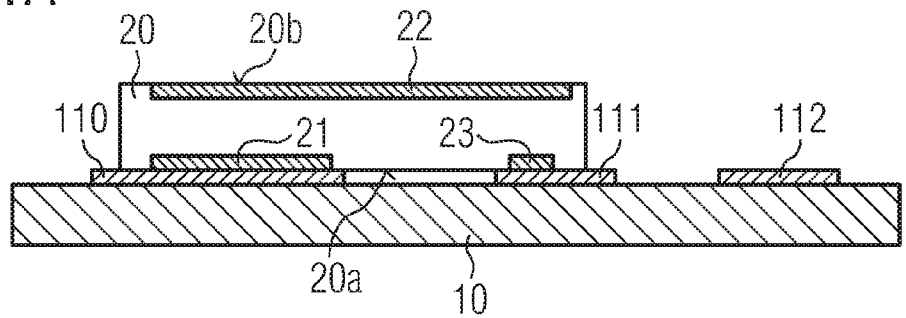
FIGS. 1A to 1D schematically illustrate a method according to one example embodiment.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various example embodiments described herein may be combined with each other, unless specifically noted otherwise.

Devices with semiconductor chips are described below. The semiconductor chips may be of extremely different types and may include for example integrated electrical or electro-optical circuits. The semiconductor chips may, for example, be configured as power MOSFETs, such as power transistors, power diodes or IGBTs (Insulated Gate Bipolar Transistors). Furthermore, the semiconductor chips may include control circuits, microprocessors or microelectromechanical components. In one embodiment, semiconductor chips of vertical type may be involved, which are fabricated in such a way that electric currents can flow in a direction substantially perpendicular to the main surfaces of the semiconductor chips. In a semiconductor chip having a vertical structure, the electrodes through which the current is conducted are arranged on at least two surfaces of the semiconductor chip, the surfaces being arranged on two opposite sides of the semiconductor chip. In one embodiment, power transistors, power diodes and IGBTs may have a vertical structure. By way of example, the source and drain electrodes of a power transistor, the anode and cathode electrodes of a power diode and the emitter and collector electrodes of an IGBT may be situated on opposite surfaces of the respective power semiconductor chip.

The devices described below may include integrated circuits to control other integrated circuits, for example, the integrated circuits of power transistors, power diodes or IGBTs. The semiconductor chips need not be manufactured from a specific semiconductor material and, furthermore, may contain inorganic and/or organic materials that are not semiconductors, such as for example insulators, plastics or metals. Moreover, the semiconductor chips may be packaged or unpackaged.

The semiconductor chips may have electrodes (or contact pads) which allow electrical contact to be made with the semiconductor chips. The electrodes may be composed of any electrically conductive material, for example of a metal, such as copper, aluminum or gold, a metal alloy or an electrically conductive organic material. The semiconductor chips may be mounted on a substrate using die bonding technologies, in one embodiment diffusion soldering.

Substrates as set forth hereinbelow may be of any suitable material including metals, metal alloys and organic materials. The substrates may be of any shape, size or material. During the fabrication of the devices the substrate may be provided in a way that other substrates are arranged in the vicinity and are connected by connection means to the substrate with the purpose of separating the substrates. In one embodiment, substrates as described below may be configured as leadframes having at least one die pad and a plurality of leads arranged to contact electrodes of the semiconductor chips with the leads to electrically connect the device with electrical contacts outside the device. However, the substrate may also consists of a die pad only without any leads. The substrates may be fabricated from metals or metal alloys, copper, iron nickel or other materials. Furthermore, the substrates may be plated with an electrically conductive material, for example copper, silver or nickel phosphorus.

Dielectric materials as set forth hereinbelow may be an electrically insulating or mainly electrically insulating material. For example, the dielectric material may be a mold material, such as a thermoplastic or thermosetting material. Various techniques may be employed to deposit the mold material, for example compression molding or injection molding. Furthermore, the dielectric material may be a polymeric material, which can be deposited at temperatures lower than 50° C., for example at room temperatures. The polymeric material may be deposited by stencil printing. The dielectric material may further include any dielectric filling material, in one embodiment $SiO_2$, $Al_2O_3$ or AlN. The dielectric materials may have mechanical properties that under usual usage conditions ensure a high degree of mechanical stability to the chip package fabricated with the dielectric material.

Methods for assembling semiconductor chip packages as described herein may include assembling several chip packages simultaneously on a larger substrate and singulating individual chip packages by separating the substrate at suitable borderlines between the packages. Semiconductor chip packages as described herein may include more than one semiconductor chip. Furthermore, semiconductor chip packages as assembled by methods described herein may be completely covered by molding material or partially covered by molding material to expose parts of the substrate, the semiconductor chip and/or electrode connection structures. In one embodiment, the semiconductor chip packages may have elements, in one embodiment metallic elements, which electrically couple electrodes of semiconductor chips within the packages to the substrate, which elements are at least partly exposed from the mold material. Such exposed elements may be used to attach heat sink units thereon, which are appropriate to dissipate the heat generated within the semiconductor package during operation. Metallic elements, which electrically couple electrodes of semiconductor chips within the packages to the substrate and which are exposed from the mold material, may be held at ground potential during operation of the device.

One or more electrically conductive elements may be used to electrically couple the semiconductor chips to other components, such as the substrate for example. The electrically conductive elements may be bond wires, but may be other electrically conductive structures as well, such as clips. The clips may, for example, be formed by stamping or embossing metal stripes.

The devices described below include external contact elements. The external contact elements are accessible from outside the device and allow electrical contact to be made with the semiconductor chip from outside the device. Furthermore, the external contact elements may be thermally conductive and may serve as heat sinks for dissipating the heat generated by the semiconductor chips. The external contact elements may be composed of any desired electrically conductive material, for example of a metal, such as copper, aluminum or gold, a metal alloy or an electrically conductive organic material. The external contact elements or surfaces of them may also form assembly planes to mount the device onto another element or to mount another element onto the device.

FIGS. 1A to 1D schematically illustrate a method according to an example embodiment. According to FIG. 1A, a substrate 10 having a protruding element 110 is provided. Additionally, further protruding elements 111, 112 adjacent to the protruding element 110 may be provided on the substrate 10. Although the number of protruding elements is limited to three in FIG. 1 for reasons of clarity, any number of protruding elements may be provided on the substrate 10. The protruding elements 110, 111, 112 may be manufactured by printing, for example ink jet printing, or may be small pre-shaped plates applied to the substrate 10 by a placing process. In case of ink jet printing, the used ink may contain electrically conductive particles. In case of placing pre-shaped plates on the substrate 10, the plates may be manufactured from metals or metal alloys, such as copper, aluminum or iron nickel. The plates may be attached to the substrate 10 by soldering, for example diffusion soldering, or gluing. The height of the protruding elements 110, 111, 112 may be in the range from 10 nm to 100 μm. The protruding elements 110, 111, 112 may be arranged according to a structured pattern on the substrate 10. The protruding elements 110, 111, 112 may be applied to the substrate 10 in such a way that the surfaces of the protruding elements 110, 111, 112 opposite to the upper surface of the substrate 10, on which they are applied, may form an essentially planar surface parallel to the upper surface of the substrate 10. The substrate 10 itself may be manufactured from metals or metal alloys. In one embodiment, other materials than metals or metal alloys may be used, for example ceramic or paper materials.

A semiconductor chip 20 having a first electrode 21 on a first surface 20a and a second electrode 22 on a second surface 20b is placed on the substrate 10 in such a way that the first electrode 21 is placed over the protruding element 110. In one embodiment, the semiconductor chip 20 may be a vertical power semiconductor chip having a third electrode 23 on the first surface 20a, in which case the vertical power semiconductor chip may be placed in such a way that the third electrode 23 is placed over the protruding element 111. The semiconductor chip 20 may be a power semiconductor chip, for example a power transistor, a power diode or an IGBT. In the present embodiment, the semiconductor chip is a power MOSFET having a drain electrode 22, a source electrode 21 and a gate electrode 23. The protruding element 112 may be arranged in such a way that the outline of the semiconductor chip 20 defined by the surface 20a does not overlap the protruding element 112. The area of the protruding elements 110 and 111 may be larger than the area of the electrodes 21 and 23, respectively, and the protruding elements 110 and 111 may partly reach over the outline of the semiconductor chip 20 defined by the surface 20a. The protruding elements 110, 111 and 112 may be arranged as contact pads for the electrodes 21, 22 and 23 of the semiconductor chip 20, respectively. The semiconductor chip 20 may be attached to the protruding elements 110 and 111 by reflow soldering, diffusion soldering or adhesive bonding by using an electrically conductive adhesive.

Figure 1B:
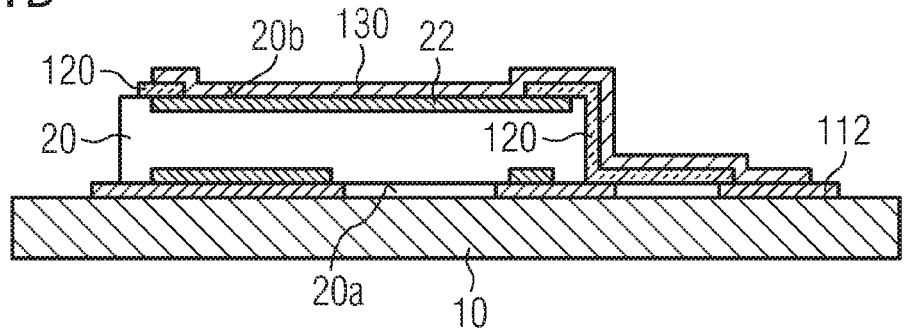

According to FIG. 1B, a dielectric film 120 is deposited in a structured manner over the semiconductor chip 20, parts of the protruding elements 111, 112 and the substrate 10. In one embodiment, the dielectric film 120 may be deposited by a printing technique or a physical or chemical vapor deposition technique. The dielectric film 120 may be arranged to expose parts of the second electrode 22 of the semiconductor chip 20. An electrically conductive film 130 is then deposited over the dielectric film 120 and the areas left exposed by the dielectric film 120. In one embodiment, the electrically conductive film 130 may be arranged to form an electrical coupling between the second electrode 22 and the protruding element 112. The electrically insulating dielectric film 120 may be arranged to prevent an electrical contact between the conductive film 130 and the protruding elements 110, 111. The conductive film 130 may consist of a metallic material, such as copper, gold, silver, nickel or any other metallic compound, and may be galvanically deposited on the dielectric film 120.

Figure 1C:
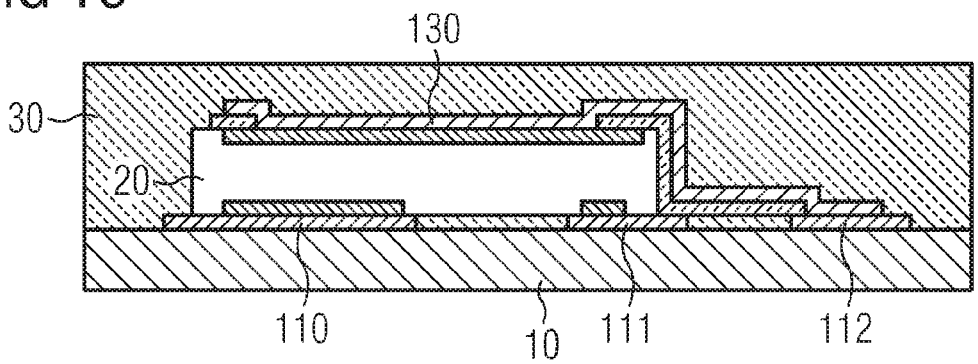

According to FIG. 1C, the semiconductor chip 20, the dielectric film 120, the conductive film 130 and the substrate 10 are covered with a mold material 30. The mold material 30 may be arranged to cover the upper surface of the substrate 20, on which the semiconductor chip 20 is mounted, and may be arranged to leave the lower surface of the substrate 10 uncovered. In one embodiment, the mold material 30 may be arranged to leave the conductive film 130 at least partially exposed. The exposed parts of the conductive film 130 may be used to couple a heat sink to the conductive film 130, improving the dissipation of heat generated during the operation of the semiconductor chip 20. The mold material 30 may be arranged to fill the space between the protruding elements 110, 111 and the surface 20a of the semiconductor chip 20.

Figure 1D:
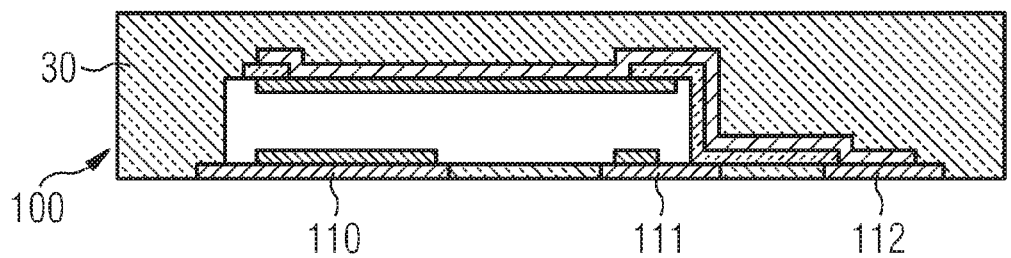

According to FIG. 1D, the substrate 10 is then removed at least partially. In one embodiment, the substrate 10 may be removed in such a way that the protruding elements 110, 111, 112 remain in the resulting device 100, but the mold material 30 is exposed at the surface originally covering the substrate 10. The substrate 10 may be removed in such a way that the protruding elements 110, 111, 112 form an essentially planar surface with the surface of the exposed mold material 30. Removing the substrate 10 may be carried out by grinding, etching, ablating, thinning, incinerating, scorching or any other suitable method appropriate for the substrate material.

Figure 2A:
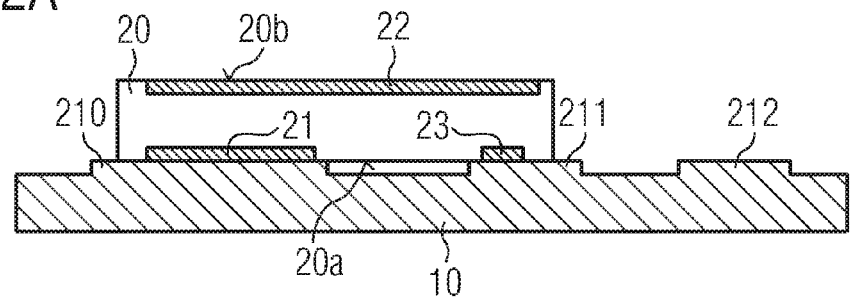
FIGS. 2A to 2D schematically illustrate a further method according to a further example embodiment.

FIGS. 2A to 2D schematically illustrate steps of a further method according to a further example embodiment. According to FIG. 2A, placing a semiconductor chip 20 on a substrate 10 is similar to the placing process illustrated in FIG. 1A. The difference between FIG. 1A and FIG. 2A is that the protruding elements 210, 211, 212 in FIG. 2A are integral parts of the substrate 10, i.e. the protruding elements 210, 211, 212 and the substrate 10 are made from one piece. In one embodiment, the protruding elements 210, 211, 212 may be generated by stamping, milling or embossing methods, if the substrate 10 is made of a metallic material such as copper, nickel, iron nickel or other metals or metal alloys. It is obvious for one skilled in the art that within one device some of the protruding elements 210, 211, 212 may be integral parts of the substrate 10, while other protruding elements may be applied as discrete elements not initially connected to the substrate 10 as illustrated in FIG. 1A.

Figure 2B:
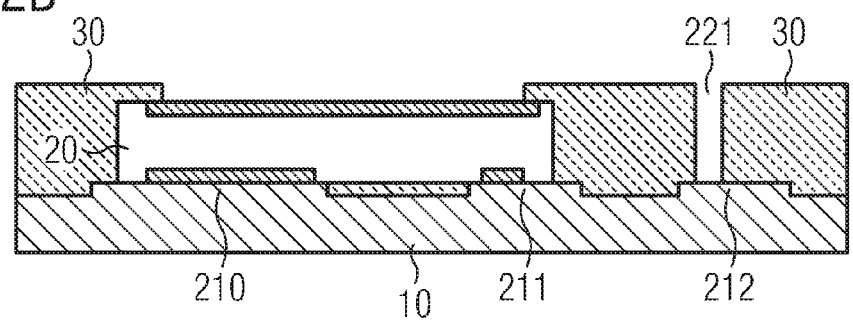

According to FIG. 2B, a dielectric material 30 is then applied to the semiconductor chip 20 and the substrate 10, covering the semiconductor chip 20 and the substrate 10 at least partially. In one embodiment, the dielectric material 30 may be applied in such a way that at least one through-hole 221 is formed over the protruding element 212. Alternatively, the through-hole 221 may be formed after the deposition of the dielectric material 30, for example by laser beam drilling. The dielectric material 30 may be arranged to cover the second surface 20b of the semiconductor chip 20. The dielectric material 30 may also be arranged to leave the second surface 20b of the semiconductor chip 20 exposed. The dielectric material 30 may be applied using stencil printing or molding processes, for example underfill molding. The dielectric material 30 may consists of polymers and may, for example, contain epoxide, polyurethane or silicone. Furthermore, the dielectric material may contain filler materials made of metals, metal oxides, semiconductors, semiconductor oxides, ceramics and/or diamond. In one embodiment, the dielectric material 30 may include $SiO_2$, $Al_2O_3$ or AlN. However, a dielectric material 30 may also be used containing no filler material. The dielectric material 30 may be liquid at temperatures below 50° C., in one embodiment at room temperatures, so that the dielectric material 30 can be deposited without heating. Later on the dielectric material 30 may be heated to harden the dielectric material 30. Alternatively, a dielectric material 30 may be used which is solid at room temperatures and is heated before its deposition.

Figure 2C:
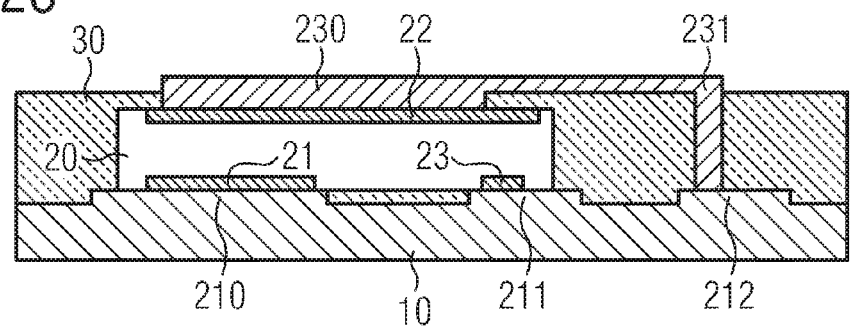

According to FIG. 2C, an electrical coupling between the second electrode 22 of the semiconductor chip 20 and the protruding element 212 is provided by applying an electrically conductive element 230 over the dielectric material 30. The through-hole 221 may be filled with the material 231 used for forming the electrically conductive element 230, in one embodiment copper, nickel or other metals or metal alloys. The dielectric material 30 may be partially removed from the second electrode 22 prior to forming the electrically conductive element 230, if the second surface 20b was covered completely with the dielectric material 30 according to FIG. 2B. The surface of the conductive element 230 facing away from the semiconductor chip 20 may be exposed from the dielectric material 30. In one embodiment, the exposed surface of the conductive element 230 may be coupled to a heat sink (not illustrated) to dissipate the heat generated during the operation of the semiconductor chip 20. Applying the electrically conductive element 230 and filling the through-hole 221 with conductive material 231 may, for example, be accomplished by galvanic deposition techniques or other plating techniques.

Figure 2D:
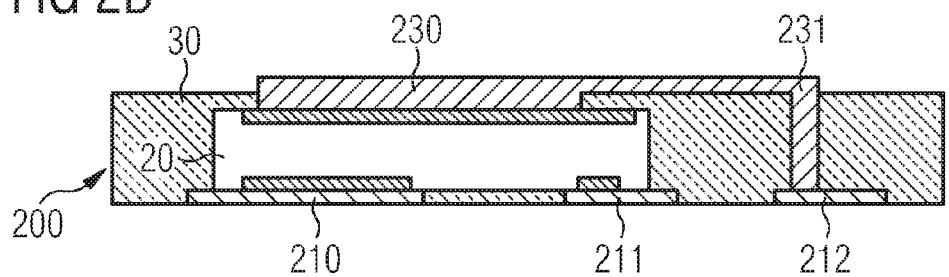

Analogously to FIG. 1D, FIG. 2D illustrates the process of removing the substrate from the resulting device 200.

It should be noted that combinations of the methods illustrated in FIGS. 1A to 1D and FIGS. 2A to 2D are possible as well. For example, after placing a semiconductor chip 20 on a substrate 10 according to FIG. 2A, it is possible to follow the method according to the FIGS. 1B to 1D. Alternatively, it is, for example, possible to deposit the dielectric layer 120 according to FIGS. 1B during execution of a method according to the FIGS. 2A to 2D. Other combinations of the methods described above may be feasible as well.

Figure 3A:
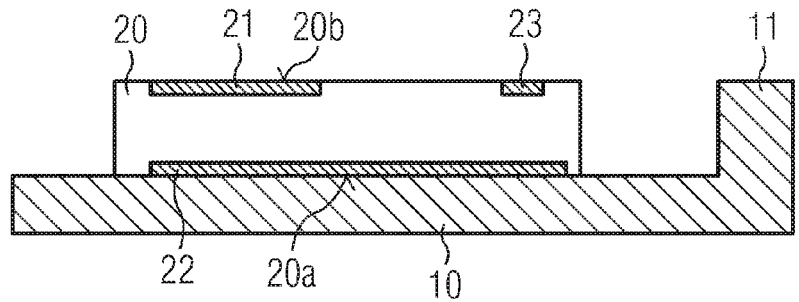
FIGS. 3A to 3D schematically illustrate a further method according to a further example embodiment.

FIGS. 3A to 3D schematically illustrate steps of a further method according to a further example embodiment. According to FIG. 3A, a semiconductor chip 20 similar to the semiconductor chip 20 in FIGS. 1 and 2 is placed on a substrate 10 with a first surface 20a facing the substrate 20. Differently from FIG. 1 and 2, however, the semiconductor chip 20 in FIG. 3A is placed such on the substrate 10 that the surface 20b, which has two electrodes 21 and 23, faces away from the substrate 10. The substrate 10 has a protruding element 11. The number of protruding elements illustrated in FIG. 3 is limited to one for reasons of clarity, however, the number of protruding elements may be greater than one. The protruding element 11 and the substrate 10 may be made from one piece. In one embodiment, the main direction of protrusion of the element 11 may coincide with the main direction of protrusion of the semiconductor chip 20 with respect to the substrate 10. The substrate 10 is made from an electrically conductive material, such as copper or iron nickel. The semiconductor chip 20 is placed over the substrate 10 in such a way that the protruding element 11 protrudes from the substrate outside an outline defined by the surface 20b of the semiconductor chip 20. The protruding element 11 may, in one embodiment, be of similar height than the thickness of the semiconductor chip 20 so that the surface 20b of the semiconductor chip 20 and the top surface of the protruding element 11 facing away from the substrate 10 form an essentially planar surface. In case the height of the protruding element 11 is not similar to the height of the semiconductor chip 20, the height difference may be compensated later on, for example by a dielectric layer or other appropriate means. In one embodiment, the height of the protruding element 11 may be in the range from 50 to 500 μm. The protruding element 11 may be formed by stamping, milling or embossing techniques or may be formed by bending an edge part of the substrate 10.

Figure 3B:
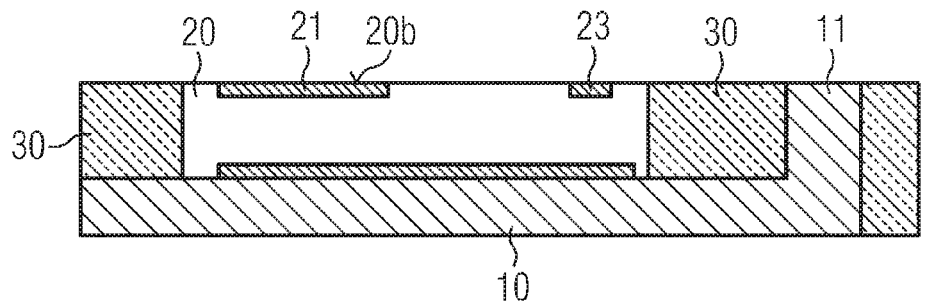

According to FIG. 3B, a dielectric material 30 is deposited over the substrate 10. The dielectric material 30 may be arranged to cover the substrate 10, but leaves the surface 20b of the semiconductor chip 20 exposed. The dielectric material 30 may also be arranged to cover edge surfaces of the substrate 10, in one embodiment edge surfaces of the protruding element 11. The top surface of the protruding element 11 facing away from the substrate 10 may be left exposed from the dielectric material 30. The dielectric material 30 may be arranged to cover the bottom surface of the substrate 10 opposite of the surface facing the semiconductor chip 20. Alternatively, the bottom surface of the substrate 10 may be left exposed. A heat sink (not illustrated) may be coupled to the exposed surface of the substrate 10 to dissipate the heat generated during the operation of the semiconductor chip 20.

Figure 3C:
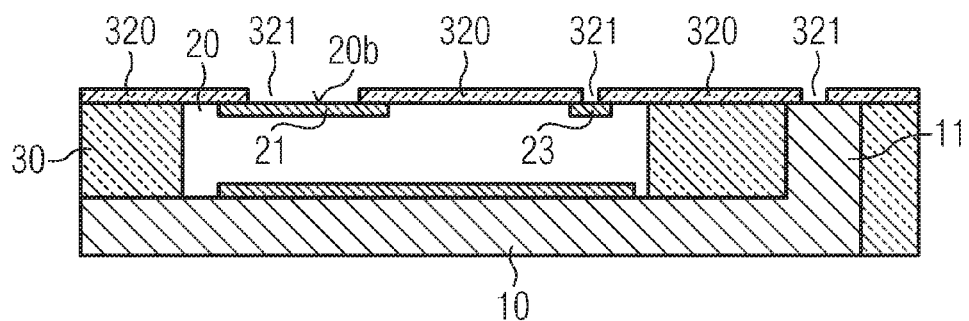

According to FIG. 3C, a dielectric layer 320 (or a photoresist layer) is deposited over the dielectric material 30, the semiconductor chip 20 and the protruding element 11. The dielectric layer 320 may be structured to create a plurality of openings 321, in one embodiment, openings 321 over the first electrode 21 of the semiconductor chip 20, over the third electrode 23 of the semiconductor chip 20 and the protruding element 11. The openings 321 may also be formed by depositing the dielectric layer 320 selectively.

Figure 3D:
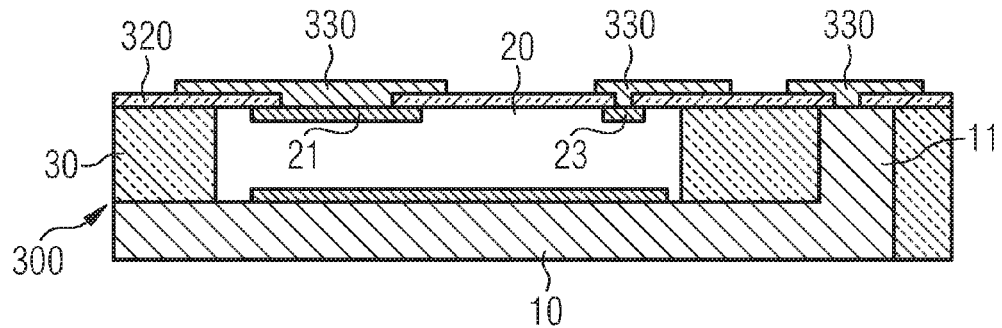

According to FIG. 3D, an electrically conductive film 330 is deposited over the dielectric layer 320. In one embodiment, the electrically conductive film 330 may be structured to cover the openings 321 and to form electrically conductive pads over the openings 321. The electrically conductive film 320 may be deposited by galvanic deposition techniques and may have a thickness in the range from 5 to 500 μm. The electrically conductive pads over the electrodes 21 and 23 may extend over the outline of the semiconductor chip 20 as defined by the surface 20b. Alternatively, the electrically conductive layer film may be produced by printing techniques, for example ink jet printing. In this case, the dielectric layer 320 may be omitted.

FIGS. 4A to 4D schematically illustrate a further method according to a further example embodiment. According to FIG. 4A, a semiconductor chip 20 similar to the semiconductor chip 20 depicted in FIG. 3A is placed with a first surface 20a on a substrate 10.

Figure 4A:
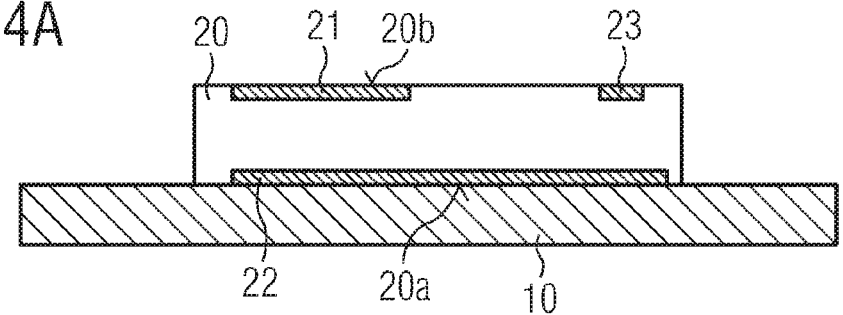
FIGS. 4A to 4D schematically illustrate a further method according to a further example embodiment.
Figure 4B:
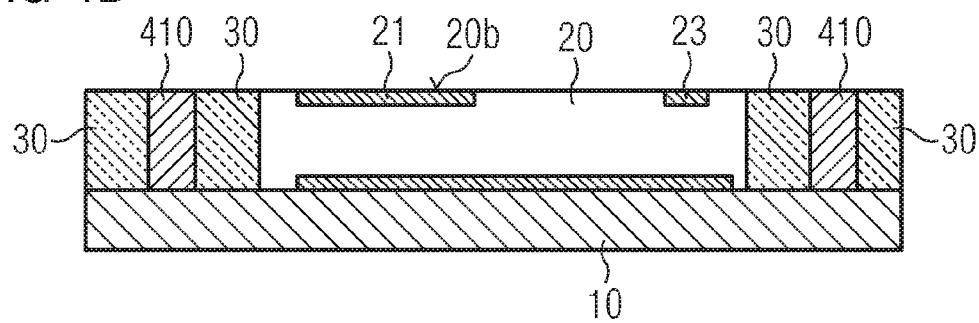

According to FIG. 4B, a dielectric material 30 is deposited on the substrate 10. The dielectric material 30 may be deposited in such a way that the second surface 20b of the semiconductor chip 20 is left exposed. The dielectric material 30 may be deposited by printing techniques, such as stencil printing, or molding techniques. In one embodiment, the dielectric material 30 may have a temperature lower than 50° C. when it is deposited, for example the dielectric material may be deposited at room temperature. After its deposition the dielectric material 30 may be cured at higher temperatures. The dielectric material may have the same properties as the dielectric material of the device 300 described above. Through-holes may also be formed by removing the dielectric material 30 partially by etching, laser beam drilling or other appropriate methods. These through-holes may be filled with a conductive material 410, such as for example copper, nickel or any other metal or metal alloy. The filling with the conductive material 410 may be accomplished by galvanic deposition techniques. Alternatively, protruding structures made from the conductive material 410 may be formed prior to depositing the dielectric material 30. The protruding structures may be made by mounting metal bumps on the substrate 10 or by galvanic deposition. After depositing the dielectric material 30, the conductive material 410 is then embedded within the dielectric material 30. In one embodiment, the extent of protrusion of the conductive material 410 may be essentially the same as the thickness of the semiconductor chip 20 so that the surface 20b of the semiconductor chip 20 and the top surfaces of the structures of the conductive material 410 may essentially form a planar surface. In case the semiconductor chip 20 and the structures of the conductive material 410 are of different heights, this height difference may be compensated by appropriate means, for example a layer of an appropriate material. The height of the protruding structures may be in the range from 50 to 500 μm.

The dielectric material 30 may include a filler material, in one embodiment $SiO_2$. Other filler materials may be used as well, such as $Al_2O_3$ and AlN. The fraction of the filler material within the dielectric material 30 may be adjusted to the desired thermomechanical properties of the dielectric material, such as the thermal conductivity and the thermal expansion coefficient. A higher amount of filler material may be used to generate a higher thermal conductivity of the dielectric material 30. The dielectric material 30 may also be deposited in layers over the substrate 10, wherein each layer of dielectric material 30 may contain a different portion the filler material. These layers may be arranged in a layer-by-layer fashion over the substrate 10.

Figure 4C:
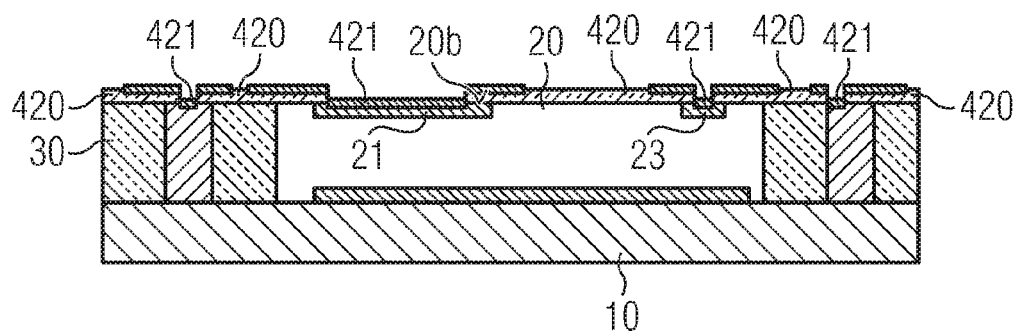

According to FIG. 4C, a photoresist layer 420 (or any other dielectric layer) is then deposited over the semiconductor chip 20, the conductive material 410 and the dielectric material 30. The photoresist layer 420 may be structured using photolithographic methods in order to create openings over the structures 410 and the electrodes 21 and 23.

A metallic seed layer 421, for example titanium or palladium, may then be applied over the openings and parts of the photoresist layer 420. The metallic seed layer 421 may be applied to parts of the surface of the device 400 which may serve as contact pad surfaces for the electrodes 21, 23 and the conductive material 410. The metallic seed layer 421 may be, for example, deposited electroless or by sputtering and may have a thickness in the range between 20 and 300 nm.

Figure 4D:
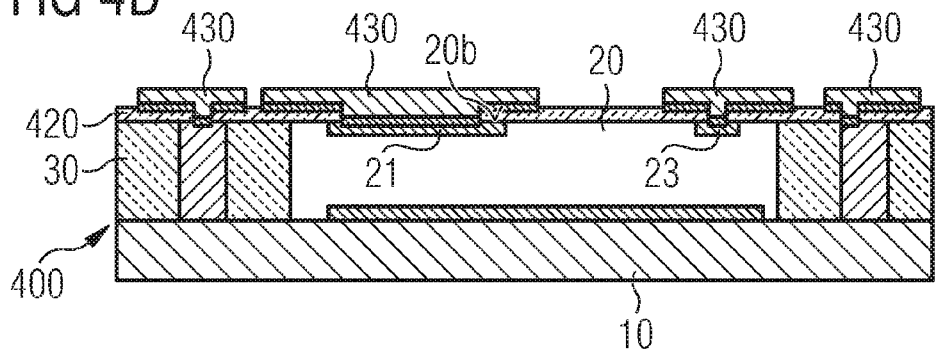

According to FIG. 4D, an electrically conductive film 430 is then deposited over the metallic seed layer 421. In one embodiment, the depositing of the electrically conductive film 430 may be accomplished by galvanic deposition. The electrically conductive film 430 may have a thickness of more than 5 μm. The areas of extension of the contact pads formed by the electrically conductive layer may in one embodiment be larger than the areas of the surfaces of the electrodes 21, 23 and/or the exposed surfaces of the conductive material 410, respectively. The contact pads may extend over the outline of the semiconductor chip 20 defined by its surface 20b. The electrically conductive film 430 may be formed of a metallic material, in one embodiment copper, nickel or any other appropriate metal or metal alloy.

As an alternative to the galvanic deposition, the electrically conductive film 430 may be produced by printing techniques, for example ink jet printing. In this case, the dielectric layer 420 and/or the seed layer 421 may be omitted.

It should be noted that combinations of processes of the methods detailed in FIGS. 1 to 4 may be possible as well. One skilled in the art will recognize furthermore that the methods illustrated in FIGS. 1 to 4 can be completed for more than one semiconductor chip on a common substrate. It is possible to form devices according to the methods of FIGS. 1 to 4 adjacent to each other on a common substrate and separate the devices by dicing or any other singulation technique. In one embodiment, it will be obvious for one skilled in the art to use the methods illustrated in FIGS. 1 to 4 in a batch process, in which at least two devices can be formed simultaneously and then separated from each other.

In addition, while a particular feature or aspect of an embodiment of the invention may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". The terms "coupled" and "connected", along with derivatives may have been used. It should be understood that these terms may have been used to indicate that two elements co-operate or interact with each other regardless whether they are in direct physical or electrical contact, or they are not in direct contact with each other. Furthermore, it should be understood that embodiments of the invention may be implemented in discrete circuits, partially integrated circuits or fully integrated circuits or programming means. Also, the term "example" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of making a device, comprising:
providing a substrate having a first element protruding from the substrate;
providing a semiconductor chip having a first electrode on a first surface and a second electrode on a second surface opposite to the first surface;
placing the semiconductor chip over the first element of the substrate with the first surface of the semiconductor chip facing the substrate;
electrically coupling the second electrode of the semiconductor chip to the substrate; and
removing the substrate at least partially.

2. The method of claim 1, comprising not removing the first element when the substrate is removed.

3. The method of claim 1, comprising removing the substrate by grinding or etching.

4. The method of claim 1, comprising wherein the substrate is made of a metal or a metal alloy or a ceramic material or a paper material.

5. The method of claim 1, comprising manufacturing the first element by printing or ink jet printing.

6. The method of claim 1, comprising covering the substrate with a dielectric material after placing the semiconductor chip on the substrate.

7. The method of claim 6, comprising depositing the dielectric material between the semiconductor chip and the substrate.

8. The method of claim 1, comprising electrically coupling the second electrode of the semiconductor chip to a second element protruding from the substrate.

9. The method of claim 1, comprising wherein the semiconductor chip has a third electrode on the first surface and the third electrode is electrically coupled to a third element protruding from the substrate.

10. The method of claim 1, comprising wherein the semiconductor chip is a power semiconductor chip.

* * * * *